United States Patent [19]

Arac

[11] Patent Number: 4,752,505
[45] Date of Patent: Jun. 21, 1988

[54] PRE-METAL DEPOSITION CLEANING FOR BIPOLAR SEMICONDUCTORS

[75] Inventor: Sabri Arac, Concord, Calif.

[73] Assignee: Hewlett-Packard Company, Palo Alto, Calif.

[21] Appl. No.: 3,532

[22] Filed: Jan. 13, 1987

[51] Int. Cl.$^4$ .......................... B05D 3/04; B05D 3/10
[52] U.S. Cl. ..................................... 427/307; 427/318; 437/228; 134/3; 134/41; 156/663
[58] Field of Search .................. 427/88, 86, 307, 318; 156/663; 134/3, 41; 148/20.3, 133

[56] References Cited

U.S. PATENT DOCUMENTS 3,704,208 11/1972 Russo ................................ 427/307
4,222,815 9/1980 Krechmery ......................... 427/88
4,439,270 3/1984 Powell .............................. 156/663

Primary Examiner—Shrive P. Beck
Assistant Examiner—Vi Duong Dang
Attorney, Agent, or Firm—James M. Williams

[57] ABSTRACT

A pre-metal deposition cleaning process for bipolar semiconductors includes a two step boron glass etching procedure: a chemical etchant consisting of DI, $H_2SO_4$, $HNO_3$ and HCl (500:65:325:163) heated to 80 deg. C. followed by a 10:1 (DI:HF) dip. The semiconductor wafer is then annealed in forming gas. Then the boron glass etching procedure is repeated. The initial etch removes any B-Si-O glass present at base contacts. The anneal removes any fluorine clustered under the boron skin, and the final etch removes any retained B-Si-O-F phase from the anneal step. The cleaning procedure produces bipolar semiconductors with low $V_{be}$. The procedure can also be used for rework of high $V_{be}$ wafers without the anneal and the second boron glass etch steps.

3 Claims, 1 Drawing Sheet

PRE-METAL DEPOSITION CLEANING FOR BIPOLAR SEMICONDUCTORS

BACKGROUND AND SUMMARY OF THE INVENTION

The invention relates to cleaning processes for bipolar semiconductor manufacturing, and in particular to a pre-metal deposition cleaning process that produces bipolar transistors having low base-emitter voltage.

Base-emitter voltage, $V_{be}$, is normally measured at 10 mA at the end of the front metal wet etch step as part of the wet etch process specification in a bipolar transistor manufacturing process. A wafer is scrapped if the $V_{be}$ is greater than 1.1 volt at 10 mA. It is well known that high $V_{be}$ is one of the major problems in bipolar device processing. The number of wafers scrapped due to high $V_{be}$ at the front metal wet etch step can be as much as 10% to 15%.

The invention provides a pre-metal deposition cleaning process for bipolar semiconductors that consistently produces wafers having low $V_{be}$. According to the invention, the cleaning procedure includes a two step boron glass etching procedure: a chemical etchant consisting of DI (deionized water), $H_2SO_4$, $HNO_3$ and HCl (500:65:325:163) heated to 80 deg. C. followed by a 10:1 (DI:HF) dip. The semiconductor wafer is then annealed in forming gas. Then the boron glass etching procedure is repeated. The initial etch removes any B-Si-O glass present at base contacts. The anneal removes any fluorine clustered under the boron skin, and the final etch removes any retained B-Si-0-F phase from the anneal step. The cleaning procedure produces bipolar semiconductors with low $V_{be}$. The procedure of the invention can also be used for rework of high $V_{be}$ wafers without the anneal and the second boron glass etch steps.

DETAILED DESCRIPTION OF THE INVENTION

Figure 1:
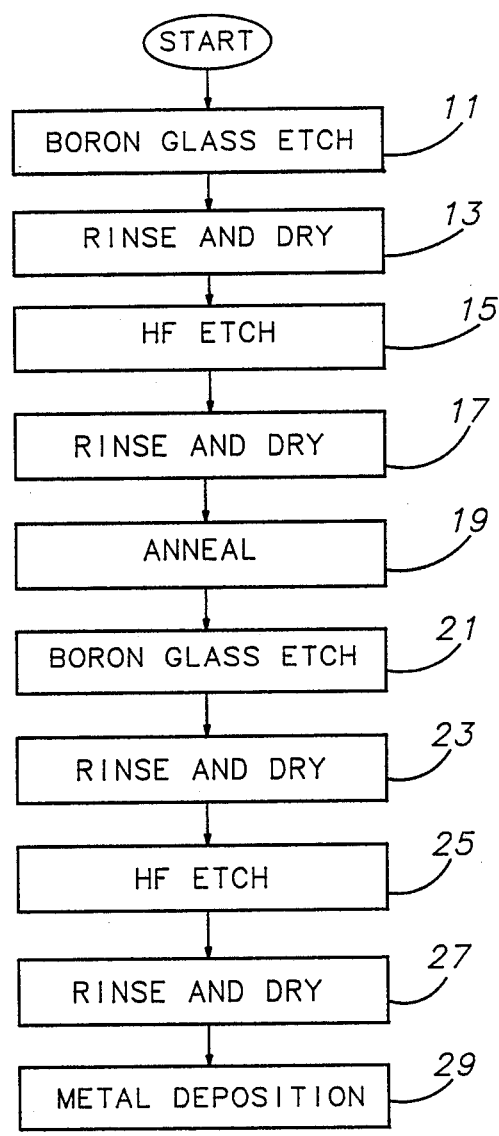
FIG. 1 is a flow chart of the steps of the cleaning procedure of the preferred embodiment of the invention.

The conventional cleaning process prior to metal deposition on bipolar transistors includes an RCA clean ("Cleaning Solutions Based on Hydrogen Peroxide for use in Silicon Semiconductor Technology", Kern and Puotinen, RCA Review, June 1970), followed by a 15 second acid etching dip in a 10:1 DI:HF solution to remove any $SiO_2$ from both base and emitter contacts. The metal deposition is performed within 15 minutes after cleaning. The acid dip removes about 75 to 120 angstroms of $SiO_2$ depending on the integrity of the oxide structure. It is known that silicon surfaces will form a native oxide layer less than or equal to 20 angstroms thick at room temperature in air. The native oxide passivates the silicon surface, stopping further oxidation of the silicon at room temperature in air. An anionic type of fluorochemical surfactant is typically included in the acid etch solution to improve the wetting of the surface of the wafer.

The inventor has found that high $V_{be}$ was related to the base contacts only. At higher $V_{be}$, Rb (base contact resistance) was much larger than $R_e$ (emitter contact resistance), and they were almost equal to each other at low $V_{be}$. This effect is related to the high dose levels of base insert $BF_2$.

It is known that insoluble fluorine clusters together under the base contacts close to the surface if an oxide is present at the surface. The fluorine will leave the surface by taking Si atoms, producing very rough craters at the surface during the metal anneal step. The fluorine clustering close to base surfaces also creates the silicon lattice damages which then produce high resistive base contacts.

The inventor has found that the oxide skin at the base contacts is B-Si-O-F glass and this blocked fluorine escape. The invention is a cleaning process that includes a wet etch to specifically attack the B-Si-O-F phase. An anneal step under forming gas follows the boron skin etch step, and the boron skin wet etch step is repeated before metal deposition. The initial etch removes any B-Si-O glass present at base contacts. The anneal removes any fluorine clustered under the boron skin, and the final etch removes any retained B-Si-O-F phase from the anneal step. The new procedure consistently produces wafers with high $V_{be}$.

The boron glass etch process step of the invention can be used with no annealing step for reworking wafers previously scrapped because of high Vbe (1.1 V to 3.2 V).

Cleaning Procedure

The details of the cleaning procedure of the invention are illustrated in the flow chart of FIG. 1

The wafers are loaded into a glass wafer carrier, and dipped into the boron glass etch solution for 45 seconds (step 11). After etching, the wafers are rinsed and dried (step 13). The first rinse is in an overflow rinser for five seconds, after which the wafers are immediately transferred into a teflon wafer carrier and are rinsed in a dump rinser for 5 cycles. Then the wafers are dried in a spin/rinser dryer.

In the second etching step (step 15) the wafers are dipped in a 10:1 DI:HF solution for 15 seconds. The wafers are then rinsed in the overflow rinser for 1 minute, rinsed in the dump rinser for 5 cycles, and dried in the spin/rinser dryer (step 17).

This two step each procedure removes any B-Si-O glass present at the base contacts.

Unballasted devices are annealed in forming gas at 415 C. for 45 minutes (step 19). The annealing removes any fluorine clustered under the boron skin. Ballasted devices can go directly to the metal deposition step (step 29).

The boron glass etch, rinse and dry, HF etch, and final rinse and dry steps are repeated in steps 21, 23, 25 and 27. This repeated two step etch removes any retained B-Si-O-F phase from the anneal step.

For optimum results, the wafers should be placed in the metal deposition system (step 29) as soon as possible, certainly within 15 minutes.

A boron glass etch solution of the proper proportions can be prepared by combining 500 ml of DI water, 65 ml of sulfuric acid and 325 ml of nitric acid. After waiting 15 minutes, add 163 ml of hydrochloric acid and heat the solution to 80 deg. C., +/− 2 deg. C. It is important to maintain the etchant at the proper temperature during the etching procedure.

I claim:

1. A method of cleaning silicon wafers for bipolar semiconductor devices and performing metal deposition to produce devices having low $V_{be}$, comprising the following steps performed in the order listed:
- etching a silicon wafer with a wet etch solution that attacks only the B-Si-O-F phase;
- annealing the silicon wafer in a reducing gas environment to drive off the Fluorine;
- etching the silicon wafer with a wet etch solution that attacks only the B-Si-O-F phase; and
- placing the silicon wafers in a metal deposition system within about 15 minutes.

2. The method of claim 1 wherein the wet etch procedure comprises dipping the wafer in a chemical etchant consisting of deionized water, $H_2SO_4$, $HNO_3$ and HCl (500:65:325:163) heated to 80 deg. C. followed by dipping the wafer in a 10:1 (deionized water:HF) solution before metal is deposited.

3. A method for reworking high $V_{be}$ silicon wafers for bipolar semiconductor devices and performing metal deposition to produce devices having low $V_{be}$, comprising the following steps performed in the order listed:
- etching a silicon wafer with a wet etch solution that attacks only the B-Si-O-F phase; and
- placing the silicon wafers in a metal deposition system within about 15 minutes.

* * * * *